United States Patent
Christner et al.

(10) Patent No.: US 12,177,320 B2
(45) Date of Patent: Dec. 24, 2024

(54) MULTI-OBJECTIVE COMPRESSION FOR DATA TIERING IN A STREAM DATA PLATFORM

(71) Applicant: Dell Products L.P., Round Rock, TX (US)

(72) Inventors: Joel Christner, El Dorado Hills, CA (US); Raul Gracia, Barcelona (ES); Rômulo Teixeira de Abreu Pinho, Niterói (BR); Vinicius Michel Gottin, Rio de Janeiro (BR)

(73) Assignee: Dell Products L.P., Round Rock, TX (US)

( * ) Notice: Subject to any disclaimer, the term of this patent is extended or adjusted under 35 U.S.C. 154(b) by 174 days.

(21) Appl. No.: 18/062,197

(22) Filed: Dec. 6, 2022

(65) Prior Publication Data

US 2024/0187502 A1 Jun. 6, 2024

(51) Int. Cl.
*H04L 69/04* (2022.01)
*H03M 7/30* (2006.01)
*H04L 41/5022* (2022.01)
*G06F 9/455* (2018.01)

(52) U.S. Cl.
CPC .......... *H04L 69/04* (2013.01); *H03M 7/6094* (2013.01); *H04L 41/5022* (2013.01); *G06F 9/45558* (2013.01)

(58) Field of Classification Search
CPC .. H04L 69/04; H04L 41/5022; H03M 7/6094; G06F 9/45558
See application file for complete search history.

(56) References Cited

U.S. PATENT DOCUMENTS

| | | | |
|---|---|---|---|
| 11,394,397 B2 | 7/2022 | Teixeira De Abreu Pinho et al. | |
| 11,637,565 B2 | 4/2023 | Pinho et al. | |
| 2020/0125389 A1* | 4/2020 | Palermo | H04W 28/084 |
| 2022/0294470 A1 | 9/2022 | De Abreu Pinho et al. | |

OTHER PUBLICATIONS

US 11,522,558 B1, 12/2022, De Abreu Pinho et al. (withdrawn)
RabbitMQ, https://www.rabbitmq.com/clustering-compression.html (accessed Jun. 2022).
Kafka, https://www.conduktor.io/kafka/kafka-message-compression (accessed Jun. 2022).
IBM-MQ, https://www.ibm.com/docs/en/ibm-mq/9.1?topic=applications-channel-compression-in-mq-classes-java (accessed, Jun. 2022).
Apache Pulsar, https://streamnative.io/en/blog/tech/2021-01-14-pulsar-architecture-performance-tuning/ (accessed Jun. 2022).
U.S. Appl. No. 17/648,000, titled "Compression-as-a-Service for Data Transmissions," filed Jan. 14, 2022.
U.S. Appl. No. 18/047,486, titled "Compression On-Demand in a Stream Data Platform," filed Oct. 18, 2022.

* cited by examiner

*Primary Examiner* — Joseph J Lauture
(74) *Attorney, Agent, or Firm* — Workman Nydegger

(57) ABSTRACT

A method includes identifying, by a server module running at a stream data platform, a set of data to be moved to a target data storage tier of the stream data platform, querying, by the server module, service level agreement (SLA) objectives of the target data storage tier, fetching, by the server module, the set of data, selecting, by the server module, a compressor based on the SLA objectives, compressing the set of data using the selected compressor, and storing the set of data in the target data storage tier.

20 Claims, 4 Drawing Sheets

MULTI-OBJECTIVE COMPRESSION FOR DATA TIERING IN A STREAM DATA PLATFORM

FIELD OF THE INVENTION

Some embodiments of the present invention generally relate to data compression. More particularly, at least some embodiments of the invention relate to systems, hardware, software, computer-readable media, and methods, for context-aware data compression in environments that comprise various types of data storage tiers.

BACKGROUND

Data compression is widely used in data movement, data transmission, and data storage scenarios to improve bandwidth usage and save storage. Streams are a type of data that usually benefits from compression because of the likelihood of pattern repetitions and predictability over time. Indeed, stream processing platforms and message queueing (Pub/Sub) frameworks allow the use of compression at different levels. Some include compression at the client/publisher side only, to save on bandwidth. Others, which also handle stream/message archives, may include compression for saving on storage too. Dell for example, currently offers the Stream Data Platform (SDP) as an approach to manage stream workloads through the Pravega stream management framework. Neither the SDP nor Pravega offer compression at present.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

DETAILED DESCRIPTION OF SOME EXAMPLE EMBODIMENTS

Figure 1:
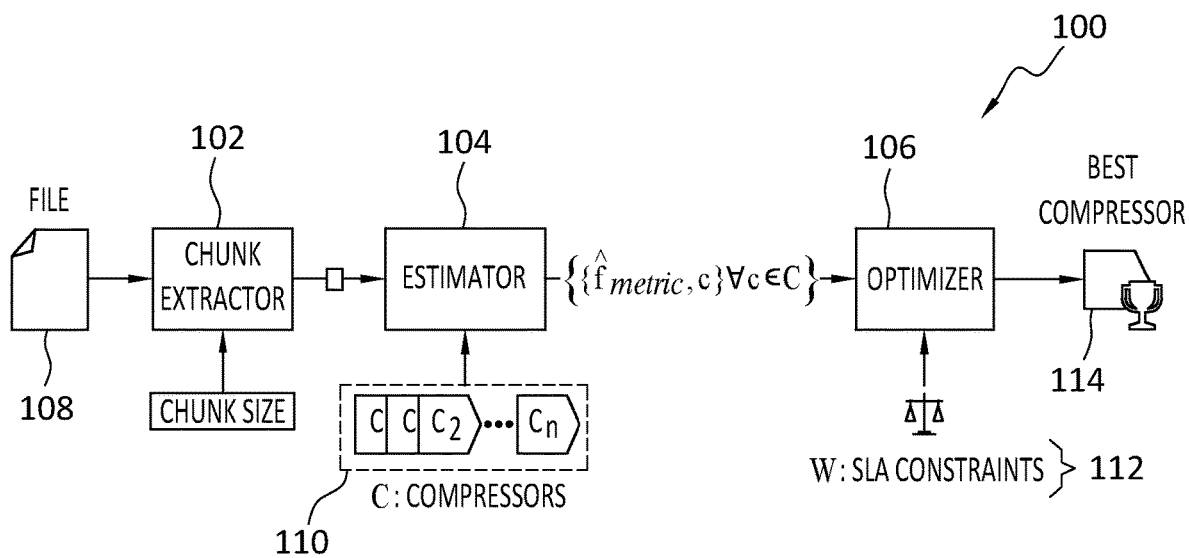
FIG. 1 discloses aspects of an example architecture to estimate compressor performance characteristics.

Some embodiments of the present invention generally relate to data compression. More particularly, at least some embodiments of the invention relate to systems, hardware, software, computer-readable media, and methods, for context-aware data compression in environments that comprise various types of data storage tiers.

For example, at least some embodiments of the invention may comprise a framework to support the dynamic and intelligent selection of lossless compression algorithms in a stream data platform with tiering mechanisms. One or more embodiments may focus on compression carried out at the server side, where data streams are received from clients, possibly arriving in compressed format. An embodiment may implement a protocol that makes the most of stream compression across data tiers, considering the SLAs imposed by each of them when moving data.

In more detail, some example embodiments of the invention embrace approaches for content and context-aware data compression at the server module of a stream data platform, while stream data is moved across tiers with different objectives. In one embodiment, a server, which may have visibility across various different storage tier configurations, may instantiate a compression module that has a pool of different data compressors. Each of the storage tiers may be configured with respective SLA (service level agreement) requirements. In operation, the server may receive a stream of client data, which may be compressed or uncompressed. When storing the client data, or moving client data across tiers, the server may query the respective SLA objectives of the tiers involved, to determine which type of compression will be implemented for the data, which may then be compressed according to the SLA requirements. As part of the data compression operations, the selected compressor may add or replace compression metadata in the data stream. The compression metadata may be read when the data is moved across tiers so that the data may be decompressed, and then recompressed, according to the SLA objectives of the target tier to which the data is to be moved.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. For example, any element(s) of any embodiment may be combined with any element(s) of any other embodiment, to define still further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

In particular, one embodiment may implement context-specific data compression for data. An embodiment may provide the flexibility to automatically compress data in different ways according to SLA requirements of a storage tier where the data is to be stored after compression. Various other advantages of some example embodiments will be apparent from this disclosure.

It is noted that embodiments of the invention, whether claimed or not, cannot be performed, practically or otherwise, in the mind of a human. Accordingly, nothing herein should be construed as teaching or suggesting that any aspect of any embodiment of the invention could or would be performed, practically or otherwise, in the mind of a human. Further, and unless explicitly indicated otherwise herein, the disclosed methods, processes, and operations, are contemplated as being implemented by computing systems that may comprise hardware and/or software. That is, such methods processes, and operations, are defined as being computer-implemented.

A. Aspects of Some Example Operating Environments

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, data protection operations which may include, but are not limited to, data replication operations, IO replication operations, data read/write/delete operations, data storage operations, data transfer operations, data deduplication operations, data backup operations, data restore operations, data cloning operations, data archiving operations, and disaster recovery operations. More generally, the scope of the invention embraces any operating environment in which the disclosed concepts may be useful.

At least some embodiments of the invention provide for the implementation of the disclosed functionality in backup platforms, examples of which include the Dell-EMC Net-Worker and Avamar platforms and associated backup software, and storage environments such as the Dell-EMC DataDomain storage environment. In general however, the scope of the invention is not limited to any particular data backup platform or data storage environment.

New and/or modified data collected and/or generated in connection with some embodiments, may be stored in a data protection environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service read, write, delete, backup, restore, and/or cloning, operations initiated by one or more clients or other elements of the operating environment. Where a backup comprises groups of data with different respective characteristics, that data may be allocated, and stored, to different respective targets in the storage environment, where the targets each correspond to a data group having one or more particular characteristics.

Example cloud computing environments, which may or may not be public, include storage environments that may provide data protection functionality for one or more clients. Another example of a cloud computing environment is one in which processing, data protection, and other, services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

Note that as used herein, the term 'data' is intended to be broad in scope. Thus, that term embraces, by way of example and not limitation, data segments such as may be produced by data stream segmentation processes, data chunks, data blocks, atomic data, emails, objects of any type, data streams which may be compressed or uncompressed, files of any type including media files, word processing files, spreadsheet files, and database files, as well as contacts, directories, sub-directories, volumes, and any group of one or more of the foregoing.

Example embodiments of the invention are applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

As used herein, the term 'backup' is intended to be broad in scope. As such, example backups in connection with which embodiments of the invention may be employed include, but are not limited to, full backups, partial backups, clones, snapshots, and incremental or differential backups.

B. Context for Some Embodiments

In general, data compression in stream platforms may be either present, or absent, with little or no margin for adaptability. To illustrate, a group of pre-configured compression algorithms may be available with only a handful of static configurations applied to message channels individually or to the entire platform. Further, such compression algorithms may be suited for compression of static, or in situ, data but are not well adapted for use in the compression of streaming data. A streaming and messaging framework may provide facilities to enable or disable compression. In such an approach however, compression may start at the client side and may only be statically enabled or disabled by way of framework configuration files. One approach may enable server side (re)compression, but such an approach may support only a handful of pre-configured compression algorithms that apply to a message channel or to the whole framework once compression is switched on. Another approach may be to allow sender and receiver ends of a communication channel to negotiate on a compression algorithm they both support out of a list of pre-existing compression algorithms. At the server side, a messaging framework may simply store the compressed stream batches as they come, or decompress them to serve stream consuming applications.

C. General Aspects of Some Example Embodiments

At present, there is no known approach for moving stream data across various types of data storage tiers with multiple, and different, respective compression objectives for each tier, as provided by some embodiments of the invention. For example, an embodiment may be content aware and may thus be able to handle multiple, different, compression objectives dynamically, such as by way of the use of a variety of different compression algorithms. Further, an embodiment may implement selection of compression algorithms for stream data, which may be significantly more challenging than selection of compression algorithms for static objects, such as files, due to the inherent dynamism of data streams.

Thus, embodiments may be particularly useful in circumstances where, for example, stream platforms manage data storage via some tiering mechanism where data is moved across different storage tiers to adapt to different SLAs. Faster storage areas such as memory typically serve near real time applications, while, at the other end of the spectrum, slower storage areas such as cloud buckets typically store historical data. Different compression constraints may thus be required across the different tiers to meet the variety of SLA objectives demanded by each tier.

Accordingly, some embodiments of the invention may be flexible at least in the sense that they may employ different types of data compression depending upon the characteristics of the data, SLAs, and a storage destination where the compressed data is to be stored. Note that data compression efficiency may be a subjective term whose meaning may vary according to application SLAs. For instance, in archival objectives, compression ratio is typically optimized at the cost of using more computation resources. In data transmissions, on the other hand, compression and/or decompression speeds, that is, the speed with which data is compressed and decompressed, may be favored over compression ratios, in the interest of avoiding latency issues that may otherwise arise where data is efficiently compressed, but the compression process is relatively slow.

In more detail, some embodiments of the invention may be applicable to stream and message processing platforms where lossless data compression may be beneficial. An embodiment may assume a stream processing architecture comprising client modules, which may collect the stream data and send that data to the server through a communication channel, and a server module that handles aggregation, management, and storage. An embodiment may further assume that the server module manages several storage tiers to store and retrieve compressed stream data as they are received from stream generators or consumed by stream processing applications.

Thus, example embodiments may comprise a method, an architecture, and a protocol to enable lossless, content and context-aware compression at the server module, while stream data is moved across tiers with different objectives, which may be defined in respective SLAs, for example. One or more embodiments of the invention may comprise any group of one or more of the following elements:

1. at start-up time, a server may instantiate a compression module that has a pool of compressors—the server may have visibility over several storage tiers, which may each be configured for different respective objectives—for example, fast storage for hot data, slow storage for cold data, or cloud bucket for archival data storage;
2. each data storage tier may be configured with compression SLA objectives, with parameters defining the relative importance of compression ratio, compression and decompression speed, memory consumption, and CPU usage—for example, a hot data tier may be configured to minimize compression and decompression latency, even if it implies low compression ratios—a cold data tier, in turn, may balance compression ratios and compression throughput, but in such way as to use as little computation and memory as possible, so that it avoids resource contention with other processes running on the platform—an archival tier, generally in the cloud or on lower-performing storage devices, may be configured to maximize compression ratios, even though the compression operation takes longer to run;
3. the server may receive stream batches from a client, and such batches may arrive compressed or uncompressed—an embodiment may assume the streams are packed with metadata indicating whether the batch is compressed and, if so, which compression algorithm, and parameters were used for the data compression—the compressor may be selected from the compression pool of the compression module of the server;
4. the SLA objectives may be queried whenever the server moves data across tiers, to help determine which compression algorithm should be used—in an embodiment, the compression module may analyze each stream batch and select the best algorithm for the batch based on its content and contextual (SLA) constraints; and
5. the compression module may add, or replace, compression metadata to the packing of the stream batch before moving the stream batch to the target storage tier—in an embodiment, the compression module may read the metadata when the data is moved across tiers, so that the data can be decompressed and recompressed in accordance with SLA objectives, and/or other objectives, of the new data storage target.

D. Detailed Description of Some Example Embodiments

One embodiment of the invention may leverage an optimization procedure for compression selection, one or more examples of which, along with various other concepts, are disclosed in [1] U.S. Pat. No. 11,394,397, titled "SYSTEM AND METHOD FOR SELECTING A LOSSLESS COMPRESSION ALGORITHM FOR A DATE OBJECT BASED ON PERFORMANCE OBJECTIVES AND PERFORMANCE METRICS OF A SET OF COMPRESSION ALGORITHMS," issued 19 Jul. 2022, [2] U.S. patent application Ser. No. 17/199,914, titled "PROBABILISTIC MODEL FOR FILE-SPECIFIC COMPRESSION SELECTION UNDER SLA-CONSTRAINTS," filed 12 Mar. 2021, [3] U.S. patent application Ser. No. 17/305,112, titled "PROBABILISTIC MODEL FOR FILE-SPECIFIC COMPRESSION SELECTION UNDER SLA-CONSTRAINTS," filed 30 Jun. 2021, and [4] U.S. patent application Ser. No. 17/648,000, titled "COMPRESSION-AS-A-SERVICE FOR DATA TRANSMISSIONS," filed 14 Jan. 2022, all of which are incorporated herein in their respective entireties by this reference, and which may be referred to herein collectively as the "Data Compression Applications."

One example of such an optimization procedure and associated components is disclosed in FIG. 1, which generally discloses an example architecture for implementation of the methods disclosed in the Data Compression Applications to estimate compressor performance metrics of all compressors in a set from the execution of a single reference compressor on a chunk of the file to be compressed.

Particularly, the example configuration of FIG. 1 may comprise a pipeline 100 that may include a chunk extractor 102 configured to communicate with an estimator 104 which, in turn, is configured to communicate with an optimizer 106. In general, and as shown, the pipeline 100 may operate in connection with static data 108, that is, data that is not being streamed, such as one or more files for example. In the example of FIG. 1, a compression algorithm may be selected, for use with the data 108, out of a pool 110 of candidate compressors, using only a small section, such as a chunk for example, extracted from the data 108 by the chunk extractor 102, as input for the selection of a reference compressor. The selection may satisfy application-dependent SLA constraints 112 which may be provided as arguments to the optimizer 106, which may optimize for storage savings, speed of compression and/or decompression, cost of computation, overall time for data compression plus transmission plus decompression, or any combination thereof. An output of the optimizer 106 may be a selection of the 'best' compressor 114 to use for the data 108, given the constraints 112. Further details concerning the configuration and operation of the example pipeline 100 are disclosed in the Data Compression Applications, one or more of which also disclose an approach for extension of a compression selection methodology to support the deployment of compression-as-a-service (COMPaaS) in an edge computing environment. In COMPaaS, a virtual network service for optimal content and context-aware compression may be deployed across cloud/core/edge infrastructures, an example of which is disclosed in FIG. 2, discussed below.

Figure 2:
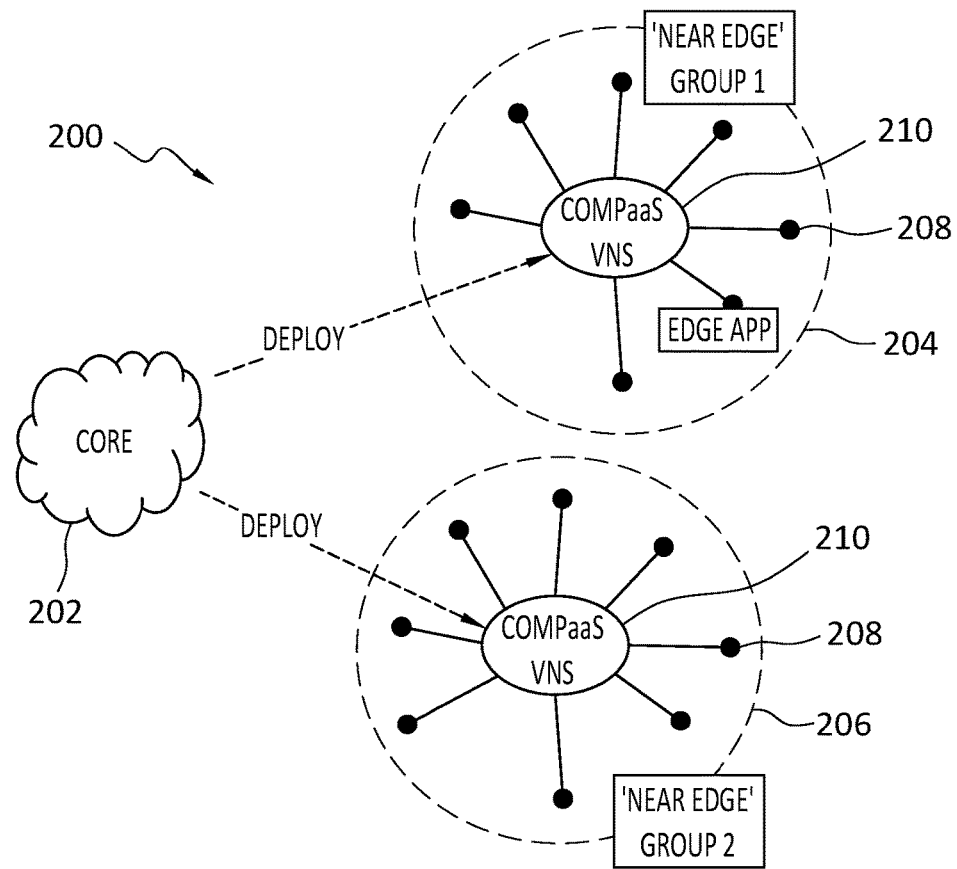
FIG. 2 discloses aspects of an example architecture in which one or more embodiments may be employed.

In general, FIG. 2 discloses a configuration that comprises cloud/core near-edge groups and edge nodes/apps are the elements used in an example COMPaaS architecture and protocol disclosed in one or more of the Data Compression Applications. One embodiment of the invention may leverage and adapt the components of COMPaaS to support the compression of streams in a stream data platform. More particularly, FIG. 2 discloses an architecture 200 that comprises a core management system 202, and one or more near-edge management systems that may each communicate with the core system 202 and with a respective group 204 and 206 of edge nodes 208. The edge nodes 208 may run applications, and communicate with a near-edge system. Respective instances of a compression virtual network service 210 may be deployed by the core management system 202 at a near edge group 204/206 whenever an application running on one of the edge nodes 208 requests a compression service to transfer data from that edge node 208 to a given destination.

As noted earlier herein, one or more embodiments of the invention may comprise a method, an architecture, and a protocol to enable lossless, content and context-aware compression at the server module of a stream data platform, while stream data is moved across tiers with different objectives. An example high-level architecture according to one embodiment is disclosed in FIG. 3.

Figure 3:
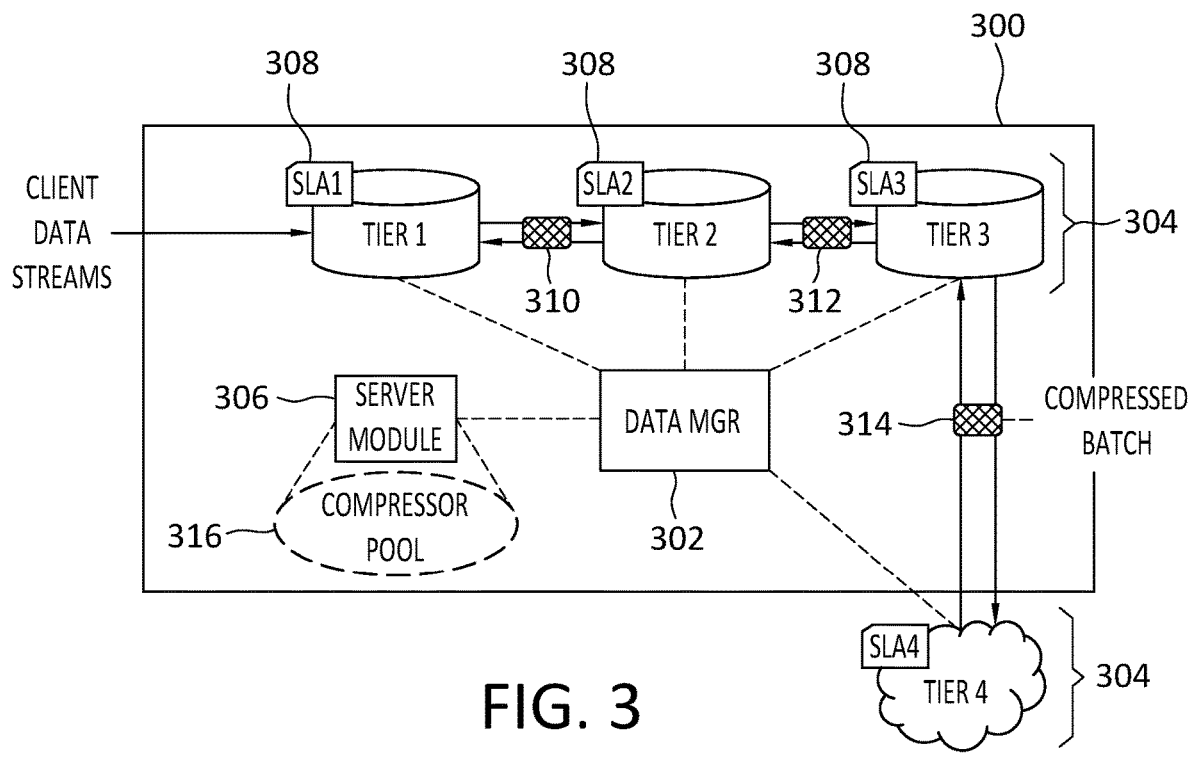
FIG. 3 discloses another example architecture in which one or more embodiments may be employed.

As shown in FIG. 3, an embodiment may comprise a data streaming platform 300, which may comprise the Dell Stream Data Platform (SDP) in one embodiment, that includes a data manager component 302 that is responsible for moving the data across all the storage tiers 304, one or more of which may comprise a cloud storage tier, managed by the platform. In an embodiment, the data streams handled by the data streaming platform 300 may be processed in batches.

D.1 Example Compression Service Configuration and Start-Up

In an embodiment, each storage tier 304 may be configured, through the server module 306, with respective compression SLA objectives 308, and/or other objectives, which may vary from one storage tier 304 to another. Such SLA objectives 308 may comprise, for example, parameters defining the relative importance of compression ratio, compression and decompression speed, and actual/expected memory consumption and CPU usage by one or more data compression processes.

The various storage tiers 304 may vary as to, at least, their respective purpose, performance, and the balance that they strike or imply between/among compression and/or decompression latency, compression and/or decompression speed, memory/processing/storage usage, and compression ratios. For example, a hot data tier, such as 'Tier 1,' where data access latency must be low and throughput must be high, since the data may frequently accessed, may be configured without compression, or, to favor low compression and decompression latency, even if such low latency may imply low compression ratios or high memory consumption. A cold data tier such as 'Tier 3,' on the other hand, holding data that is only infrequently accessed, may balance compression ratios and compression throughput, but in such way as to use as little computation, processing, and memory as possible, so that the cold data tier avoids resource contention with other processes running on the platform 300. An archival tier such as 'Tier 4,' which may be implemented in the cloud or on lower-performing storage devices, may be configured to maximize compression ratios, even though the compression operation takes longer to run. Various other storage tiers, such as 'Tier 2,' may also be provided in an embodiment. As shown in FIG. 3, data 310, 312, and 314, may be transferred between tiers 304.

At system start-up time, the server module 306 may instantiate a compression service that may have, or access, a pool 316 of compressors and that may implement one or more compression selection algorithms, examples of which are disclosed in the Data Compression Applications. The server module 306 may provide a communication interface that can be accessed by the data manager module 302, whereby requests to compress and decompress data may be sent and received.

D.2 Example Data Movement with Content and Context-Aware Compression

Figure 4:
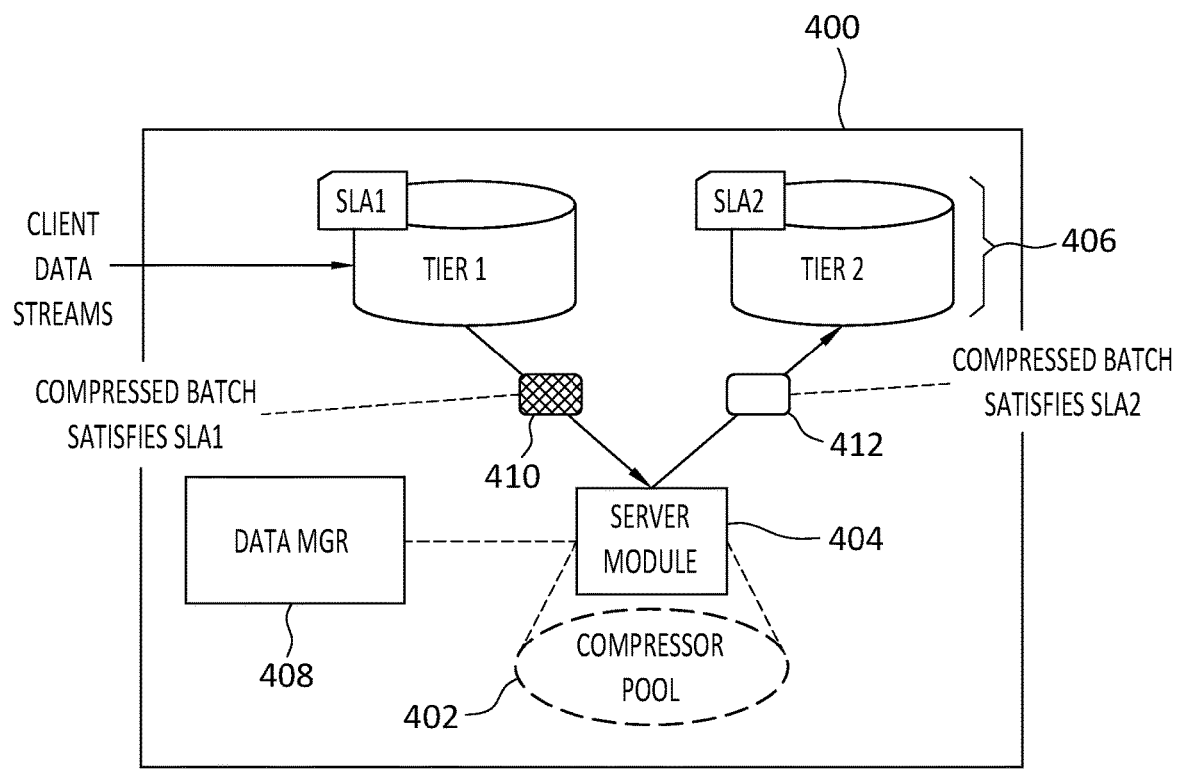
FIG. 4 discloses aspects of an example method for moving stream batches.

As shown in FIG. 3, and with reference now to FIG. 4 as well, data streams may arrive the data streaming platform 300, and data streaming platform 400, from one or more clients. Unless noted otherwise herein, the configuration and operation of the data streaming platforms 300 and 400 may be similar, or identical. In an embodiment, the data streams may have been collected by, or generated, by the clients in the form of batches. Such batches may arrive in a compressed or uncompressed format. The batches may be packed with metadata indicating whether the batch is compressed and, if so, which compression algorithm or "compressor," and associated parameters, were used to compress the batch. The compressor may be one of those in the compression pool 316 or 402 of the server module 306 or 404 so that the server module 316 or 402 is able to invoke that compressor to decompress the batch that has been received.

An embodiment may assume that data from the client data stream(s) is initially stored on Tier 1 of the stream data platform 300/400, which is the first tier 304/406 where the data may be placed after arriving from the clients. In other embodiments, the client data stream(s) received at the stream data platform 300/400 may be stored in one or more tiers in addition to, or instead of, Tier 1. An embodiment may further assume that the data in the client data stream may have been compressed to satisfy the SLA associated with that tier, that is, the tier to which the client data stream is initially directed upon receipt at the stream data platform 300/400, namely, 'SLA1,' in the example of FIGS. 3 and 4, according to the compression algorithm that was selected. In this example, the compressed stream batches stored in Tier 1 may thus be packed with an identification of the compression algorithm specified in, or implied by, SLA1.

With continued reference to FIG. 4 now, at some point in time, the data manager 408 may decides to move one or more stream batches from one tier to another tier, such as from Tier 1 to Tier 2 for example. In general, the example of FIG. 4 discloses the moving of a stream batch from Tier 1 to Tier 2 of the stream data platform 400. In this example, the batch is decompressed and recompressed with, possibly, a different compressor, so as to satisfy the compression requirements of SLA2, that is, the SLA associated with the destination storage tier for the batch.

In more detail, the data manager 408 may use various criteria to determine when data is moved, which data is moved, and the target tier to which the data will be moved. Such criteria may include, for example, a determination as to whether data is hot, that is, accessed frequently, or cold, accessed infrequently. For example, if 'hot' data is redesignated as 'cold,' that data may be moved to cloud storage, or archival storage. While the latency of operations, such as read/write operations for example, for data stored in archival storage may be relatively high, that may not be a matter of concern since the data is only infrequently accessed.

In any case, and with continued reference to the example, it is noted that Tier 2 has been configured with a different compression SLA, namely, 'SLA2,' than the compression SLA associated with Tier 1 from which the data is being moved. Note further that while reference is made herein to a 'compression SLA,' an SLA for a storage tier may comprise other information, requirements, and parameters, relating to aspects of the data other than compression. Thus, 'compression SLA' may refer to those elements of an SLA relating to data compression.

When the decision has been made to move the data, and the target storage tier, and possibly source storage tier, have been determined, the data manager 408 may then send a request to the server module 404, providing the location of the stream batch to be moved and the destination storage tier. The server module 404 may then [1] query the SLA objectives of Tier 2, that is, SLA2, [2] fetch the data batch 410 from Tier 1, [3]decompress the data batch with the compressor indicated in the packet embedded in the data batch, [4] recompress the data with a compressor selected to satisfy SLA2, [5] repack the compressed data batch, including the associated metadata, and [6] store the resulting packet, including the compressed data/metadata, 412 in Tier 2.

Note that the method just described is substantially more involved than what would be done in data tiering in storage platforms that simply move data amongst tiers of storage. Although data, in this comparative approach, may be recompressed when moving across tiers, a generic data storage platform may only employ a single type of compressor at each tier, which affects all data moved into that tier. Among other things then, and in contrast with one or more embodiments of the invention, this comparative approach lacks a pool that comprises multiple different compressors, from which one or more of the compressors may be selected for processing a stream batch.

That is, in an embodiment of the invention, which may provide a pool that comprises multiple different compressors, from which one or more of the compressors may be selected for processing a stream batch, each stream batch may be compressed differently because not only may each tier have its own respective SLA objectives, but the characteristics of the data inside the batch may, in addition to SLA objectives, also affect the selection of the compressor to be used to compress that batch. It should be noted that, depending on the SLA objectives to be satisfied, the compression selection algorithm may decide that no compressor satisfies the SLA, in which case the data in question may be moved to the destination, or target, storage tier uncompressed. A protocol according to an embodiment of the invention supports this because the uncompressed stream may also be packed with a flag indicating that the data in that stream is uncompressed. Whenever the data manager 408 decides to bring the data back from Tier 2 to Tier 1, for example, because cold data in Tier 2 has become hot again, the same process, comprising the elements [1]-[6] noted earlier, may be employed. The Server Module 404 may then decompress the data obtained from Tier 2 and recompress that data, or not, depending on the SLA and data characteristics, to satisfy the SLA1 objectives of Tier 1.

E. Further Discussion

As will be apparent from this disclosure, some embodiments of the invention may possess various useful features and aspects, a non-exhaustive list of which follows. For example, an embodiment may provide multiple different storage tiers with different respective compression SLAs. That is, each data storage tier at a server side of the stream processing platform may be configured with its own respective compression SLA objective to balance data throughput and capacity based on the needs of each tier.

As another example, an embodiment may implement multi-objective compression across storage tiers. Particularly, SLA objectives may be queried, whenever the server moves data across tiers, to help determine which compression algorithm should be used on the data. This approach may help to ensure that the throughput and capacity requirements of the target tier are taken into consideration with respect to the data that will be moved to the target tier.

As a final example, an embodiment may implement content and context-aware compression across tiers. Particularly, a compression module at a server may use data stream characteristics, and the queried SLA objective(s), to select the best compressor from the compressor pool, that is, the compressor that most closely meets the SLA objectives, given the data stream characteristics. As suggested by the foregoing, in some cases, there may be no compressor that fully meets the SLA objectives. In such as case, the compressor that most closely meets the SLA objectives may be chosen for data compression.

F. Example Methods

Figure 5:
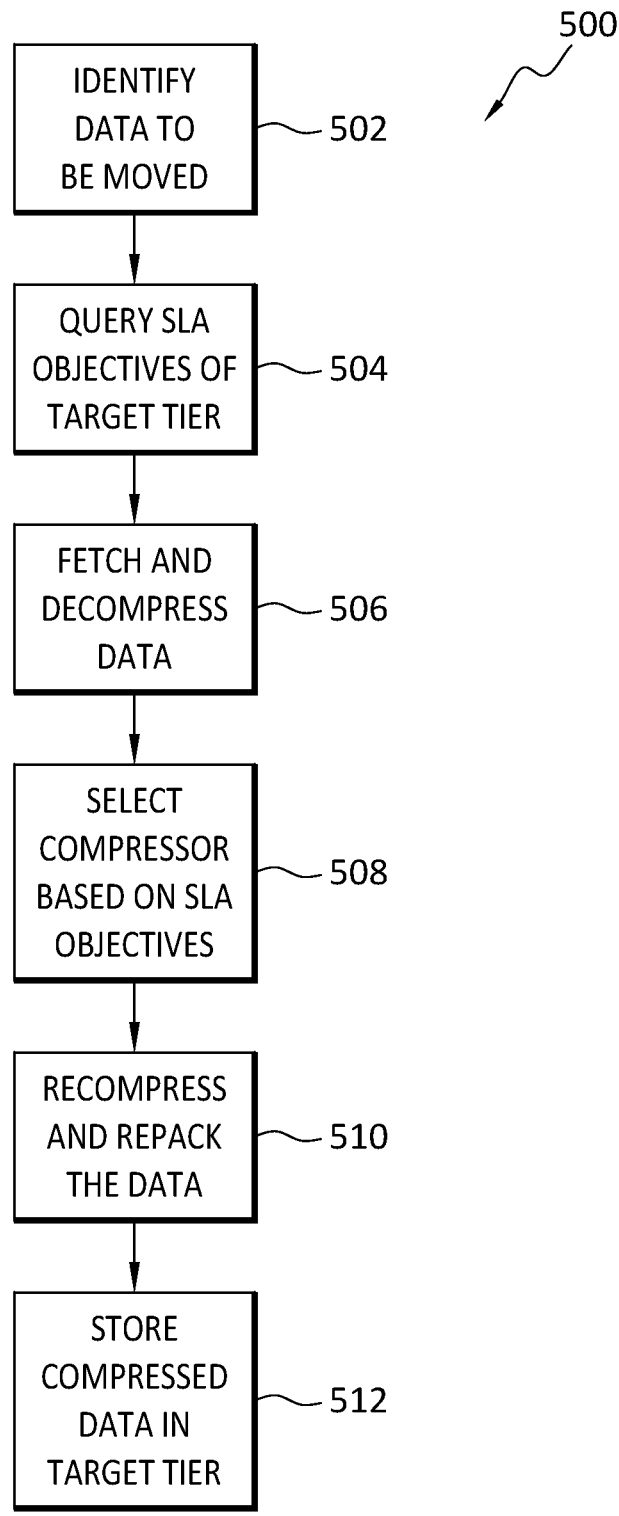
FIG. 5 discloses aspects of a method according to one embodiment.

It is noted with respect to the disclosed methods, including the example method of FIG. 5, that any operation(s) of any of these methods, may be performed in response to, as a result of, and/or based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

Directing attention now to FIG. 5, a method according to one embodiment is denoted at 500. In one embodiment, the method 500 may be performed, in whole or in part, by a server module, at the direction of a data manager, both of which may be hosted at, and run at, a stream data platform. The example method 500 may begin when data to be moved is identified. The data may comprise a portion of a client data stream, and may be compressed or uncompressed. In an embodiment, the data may be in a batch form.

After the data to be moved has been identified 502, the SLA objectives and/or other criteria of a target storage tier, to which the data is to be moved, may be queried 504. The data to be moved may then be fetched 506. If the data has been compressed prior to fetching 506, the data may be decompressed as part of 506. The compressor to be used for decompression may be selected based on compression metadata that may be in a packet embedded in the data batch.

Next, a data compressor may be selected 508 based on the SLA objectives and/or other criteria that were queried 504. Such other criteria may include, for example, information and metadata concerning one or more characteristics of the data. Such characteristics may include, for example, the compressibility of the data, and whether the data is considered 'hot' or 'cold.'

After the compressor has been selected 508, the data may then be recompressed, using the selected compressor, and repacked 510. The recompressed and repacked data may include metadata identifying the compressor that was used to compress 510 the data. The recompressed and repacked data may then be stored 512 in the target storage tier.

G. Further Example Embodiments

Following are some further example embodiments of the invention. These are presented only by way of example and are not intended to limit the scope of the invention in any way.

Embodiment 1. A method, comprising: identifying, by a server module running at a stream data platform, a set of data to be moved to a target data storage tier of the stream data platform; querying, by the server module, service level agreement (SLA) objectives of the target data storage tier; fetching, by the server module, the set of data; selecting, by the server module, a compressor based on the SLA objectives; compressing the set of data using the selected compressor; and storing the set of data in the target data storage tier.

Embodiment 2. The method as recited in embodiment 1, wherein the SLA objectives specify constraints to be satisfied by a compression algorithm to be used for data to be stored in the target data storage tier.

Embodiment 3. The method as recited in any of embodiments 1-2, wherein the set of data was compressed prior to the fetching, and the set of data is decompressed prior to being compressed with the selected compressor.

Embodiment 4. The method as recited in any of embodiments 1-3, wherein the identified set of data is received at the stream data platform from a client.

Embodiment 5. The method as recited in any of embodiments 1-4, wherein the set of data that is compressed using the selected compressor is in batch form and is packed together with compression metadata that identifies the selected compressor.

Embodiment 6. The method as recited in any of embodiments 1-5, wherein the target data storage tier includes another set of data that has been compressed differently than the set of data.

Embodiment 7. The method as recited in any of embodiments 1-6, wherein the selected compressor is a compressor that best meets the SLA objectives.

Embodiment 8. The method as recited in any of embodiments 1-7, wherein the set of data is moved based on a change to an attribute or characteristic of the set of data.

Embodiment 9. The method as recited in any of embodiments 1-8, wherein the set of data is moved from another tier of the stream data platform.

Embodiment 10. The method as recited in any of embodiments 1-9, wherein, prior to the fetching, the set of data has been packed together with compression metadata in a stream batch, and the compression metadata is replaced with compression metadata identifying the selected compressor.

Embodiment 11. A system, comprising hardware and/or software, operable to perform any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1-10.

H. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 6:
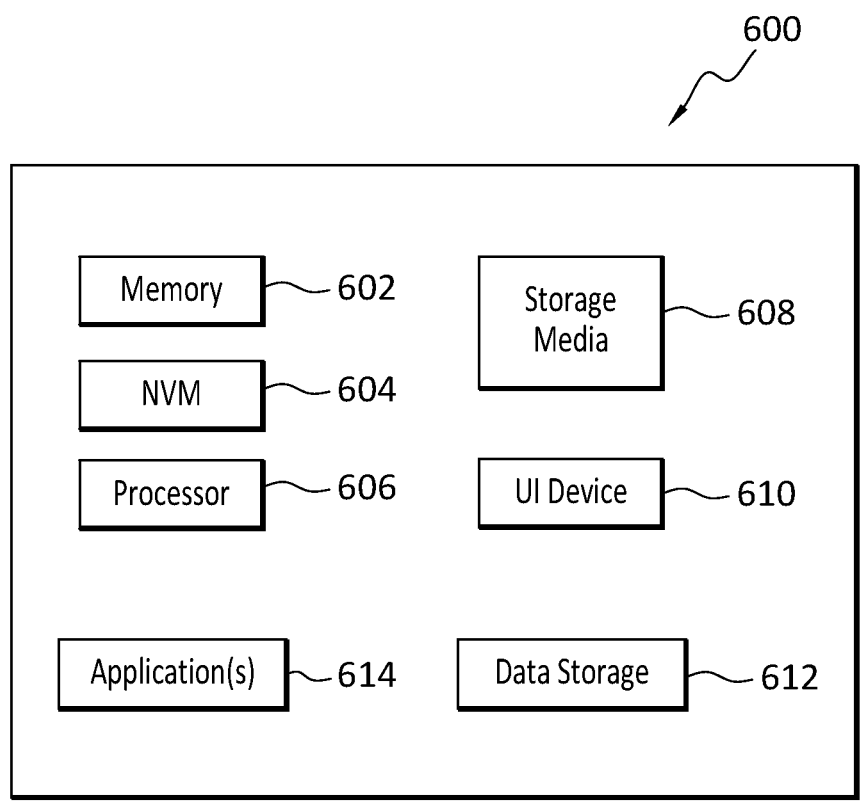
FIG. 6 discloses a computing entity operable to perform any of the disclosed methods, processes, and operations.

With reference briefly now to FIG. 6, any one or more of the entities disclosed, or implied, by FIGS. 1-5 and/or elsewhere herein, may take the form of, or include, or be implemented on, or hosted by, a physical computing device, one example of which is denoted at 600. As well, where any of the aforementioned elements comprise or consist of a virtual machine (VM), that VM may constitute a virtualization of any combination of the physical components disclosed in FIG. 6.

In the example of FIG. 6, the physical computing device 600 includes a memory 602 which may include one, some, or all, of random access memory (RAM), non-volatile memory (NVM) 604 such as NVRAM for example, read-only memory (ROM), and persistent memory, one or more hardware processors 606, non-transitory storage media 608, UI (user interface) device 610, and data storage 612. One or more of the memory components 602 of the physical computing device 600 may take the form of solid state device (SSD) storage. As well, one or more applications 614 may be provided that comprise instructions executable by one or more hardware processors 606 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
identifying, by a server module running at a stream data platform, a set of data to be moved to a target data storage tier of the stream data platform;
querying, by the server module, service level agreement (SLA) objectives of the target data storage tier;
fetching, by the server module, the set of data;
selecting, by the server module, a compressor based on the SLA objectives;
compressing the set of data using the selected compressor; and
storing the set of data in the target data storage tier.

2. The method as recited in claim 1, wherein the SLA objectives specify constraints to be satisfied by a compression algorithm to be used for data to be stored in the target data storage tier.

3. The method as recited in claim 1, wherein the set of data was compressed prior to the fetching, and the set of data is decompressed prior to being compressed with the selected compressor.

4. The method as recited in claim 1, wherein the identified set of data is received at the stream data platform from a client.

5. The method as recited in claim 1, wherein the set of data that is compressed using the selected compressor is in batch form and is packed together with compression metadata that identifies the selected compressor.

6. The method as recited in claim 1, wherein the target data storage tier includes another set of data that has been compressed differently than the set of data.

7. The method as recited in claim 1, wherein the selected compressor is a compressor that best meets the SLA objectives.

8. The method as recited in claim 1, wherein the set of data is moved based on a change to an attribute or characteristic of the set of data.

9. The method as recited in claim 1, wherein the set of data is moved from another tier of the stream data platform.

10. The method as recited in claim 1, wherein, prior to the fetching, the set of data has been packed together with compression metadata in a stream batch, and the compression metadata is replaced with compression metadata identifying the selected compressor.

11. A non-transitory storage medium having stored therein instructions that are executable by one or more hardware processors to perform operations comprising:
identifying, by a server module running at a stream data platform, a set of data to be moved to a target data storage tier of the stream data platform;
querying, by the server module, service level agreement (SLA) objectives of the target data storage tier;
fetching, by the server module, the set of data;

selecting, by the server module, a compressor based on the SLA objectives;

compressing the set of data using the selected compressor; and storing the set of data in the target data storage tier.

12. The non-transitory storage medium as recited in claim 11, wherein the SLA objectives specify constraints to be satisfied by a compression algorithm to be used for data to be stored in the target data storage tier.

13. The non-transitory storage medium as recited in claim 11, wherein the set of data was compressed prior to the fetching, and the set of data is decompressed prior to being compressed with the selected compressor.

14. The non-transitory storage medium as recited in claim 11, wherein the identified set of data is received at the stream data platform from a client.

15. The non-transitory storage medium as recited in claim 11, wherein the set of data that is compressed using the selected compressor is in batch form and is packed together with compression metadata that identifies the selected compressor.

16. The non-transitory storage medium as recited in claim 11, wherein the target data storage tier includes another set of data that has been compressed differently than the set of data.

17. The non-transitory storage medium as recited in claim 11, wherein the selected compressor is a compressor that best meets the SLA objectives.

18. The non-transitory storage medium as recited in claim 11, wherein the set of data is moved based on a change to an attribute or characteristic of the set of data.

19. The non-transitory storage medium as recited in claim 11, wherein the set of data is moved from another tier of the stream data platform.

20. The non-transitory storage medium as recited in claim 11, wherein, prior to the fetching, the set of data has been packed together with compression metadata in a stream batch, and the compression metadata is replaced with compression metadata identifying the selected compressor.

* * * * *